United States Patent [19]

Hashimoto

[11] Patent Number: 4,658,156
[45] Date of Patent: Apr. 14, 1987

[54] VOLTAGE DETECTION CIRCUIT FOR DETECTING INPUT VOLTAGE LARGER IN ABSOLUTE VALUE THAN POWER SUPPLY VOLTAGE

[75] Inventor: Kiyokazu Hashimoto, Tokyo, Japan

[73] Assignee: NEC Corporation, Tokyo, Japan

[21] Appl. No.: 679,450

[22] Filed: Dec. 7, 1984

[30] Foreign Application Priority Data

Dec. 8, 1983 [JP] Japan ............................. 58-231855

[51] Int. Cl.$^4$ ...................... H03K 5/153; G11C 8/00; G01R 31/28
[52] U.S. Cl. .................................. 307/350; 307/356; 307/296 R; 365/230; 324/158 R
[58] Field of Search ............... 307/350, 355, 356, 362, 307/363, 296 R; 365/230, 231; 324/73 R, 158 R

[56] References Cited

U.S. PATENT DOCUMENTS

| 4,318,013 | 3/1982 | Thomas et al. | 307/362 |
| 4,321,489 | 3/1982 | Higuchi et al. | 307/362 |
| 4,348,596 | 9/1982 | Atherton et al. | 307/530 |
| 4,521,696 | 6/1985 | Raghunathan | 307/350 |

Primary Examiner—John Zazworsky
Attorney, Agent, or Firm—Burns, Doane, Swecker & Mathis

[57] ABSTRACT

A voltage detection circuit for detecting an input voltage larger in absolute value than a power supply voltage is disclosed. This circuit comprises a first transistor connected between a terminal supplied with the input voltage and a circuit node, and a second and a third complementary transistors connected in series between the circuit node and a reference potential terminal. The first transistor is used as a voltage-dropping means, and the gates of the second and third transistors are commonly supplied with the power supply voltage. When the potential difference between the circuit node and the gate of the second transistor exceeds the threshold value of the same transistor, the second transistor is turned ON and the potential at the connection point of the second and third transistors begins to change. At this time, the input voltage is higher in absolute value than the power supply voltage because the first transistor operates as the voltage-dropping means.

4 Claims, 4 Drawing Figures

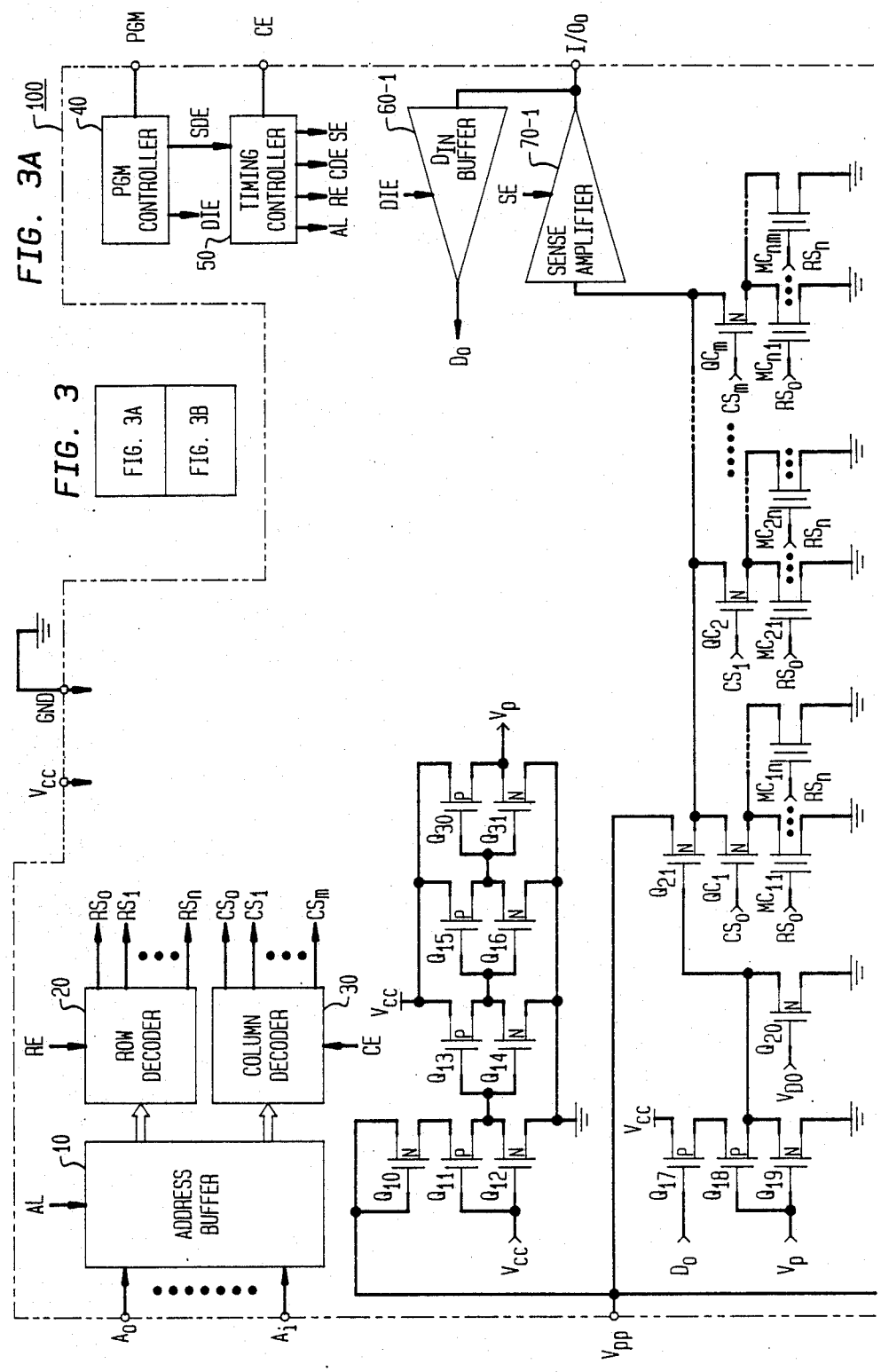

VOLTAGE DETECTION CIRCUIT FOR DETECTING INPUT VOLTAGE LARGER IN ABSOLUTE VALUE THAN POWER SUPPLY VOLTAGE

BACKGROUND OF THE INVENTION

The present invention relates to a voltage detection circuit formed as an integrated circuit device and which detects an input voltage of a predetermined level, and more particularly to a voltage detection circuit producing a detecting signal when an input voltage is larger in absolute value than a power supply voltage.

For the purpose of controlling an internal circuit operation in response to the level of an input voltage, a detection circuit is required to detect the input voltage level. For example, an electrically programmable read only memory device (hereinafter, referred as an "EPROM"), is brought into a programming operation mode when the level of a voltage supplied to a programming voltage input terminal is larger in absolute value than a power supply voltage supplied to the EPROM. There are logic circuit devices, data processing devices and/or memory devices including EPROM that have internal circuits which are placed into a test mode by supplying a predetermined terminal with a voltage larger in absolute value than a signal voltage which is supplied in an ordinary operation mode. The signal voltage supplied in the ordinary operation mode may have the same level as a power supply voltage supplied to such devices. Accordingly, a voltage detection circuit is required to detect whether or not an input voltage is larger than a power supply voltage in absolute value.

One voltage detection circuit of this type according to the prior art employs a transistor having a threshold value such that it turns ON in response to an input voltage higher than a power supply voltage, and the input voltage level is thus detected by the state of this transistor.

Another detection circuit according to the prior art utilizes a parasitic transistor formed in an integrated circuit device, this parasitic transistor being made conductive by an input voltage higher than a power supply voltage.

In both of these detection circuits, however, the manufacturing process is complicated to obtain a predetermined detection level, and it is very difficult to change the detection level.

SUMMARY OF THE INVENTION

Accordingly, an object of the present invention is to provide a voltage detection circuit having a predetermined voltage detection level without complicating the manufacturing process.

Another object of the present invention is to provide a voltage detection circuit having a simplified construction which is suitable to be formed as an integrated circuit device.

Still another object of the present invention is to provide a detection circuit for detecting an input voltage higher in absolute value than a power supply voltage by means of its circuit construction.

A voltage detection circuit according to the present invention comprises an input terminal supplied with an input voltage, a comparison terminal supplied with a comparison voltage, a circuit node, a detection output terminal, means coupled between the input terminal and the circuit node for generating a voltage drop of a predetermined level therebetween, and means coupled between the circuit node and the output terminal for outputting a detection signal when the voltage at the circuit node is larger in absolute value than the comparison voltage at the comparison terminal.

When the input voltage at the input terminal is equal to the comparison voltage at the comparison terminal, the electric potential at the circuit node is smaller than the comparison voltage in absolute value by the voltage drop between the input terminal and the circuit node. Accordingly, the detecting signal is not generated. When the input voltage is larger in absolute value than the sum voltage of the comparison voltage and the voltage drop, the output means outputs the detection signal. Thus, the voltage detection circuit according to the present invention utilizes the voltage drop means to detect the level of the input voltage, and therefore, the input voltage higher than a power supply voltage in absolute value is detected by employing a power supply voltage as the comparison voltage.

It is convenient to use as the voltage drop means a first transistor whose gate and drain are short-circuited. The voltage drop between the input terminal and the circuit node thereby becomes the threshold voltage of the first transistor. A second transistor may be used as the output means, which has a source-drain path connected between the circuit node and the output terminal and a gate connected to the comparison terminal, and further it is convenient to connect a third transistor which is in a conductive state between the output terminal and a reference potential terminal. In this case, the level of the input voltage at which the detecting signal is outputted can be changed by controlling the gate widths and/or gate lengths of the second and third transistors.

BRIEF DESCRIPTION OF THE DRAWINGS

The above and other objects, advantages and features of the present invention will become more apparent from the following description taken in conjunction with the accompanying drawings, in which.

DETAILED DESCRIPTION OF THE PREFERRED EMBODIMENTS

Figure 1:
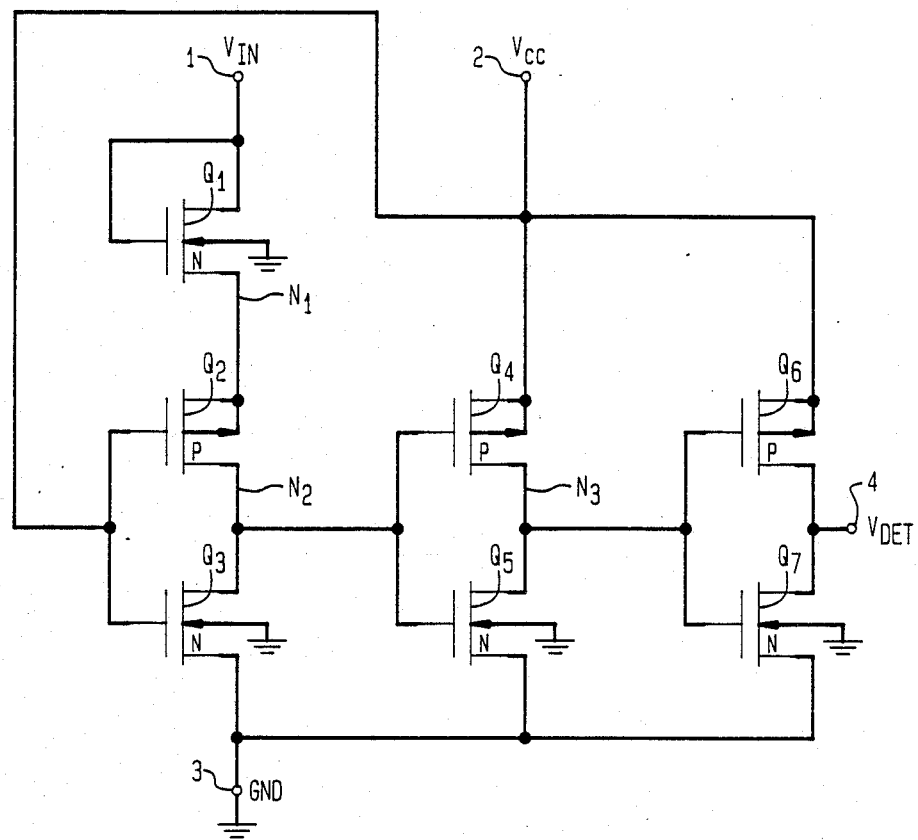
FIG. 1 is a circuit diagram of a voltage detection circuit according to one embodiment of the present invention.

Referring to FIG. 1, there is shown a voltage detection circuit according to one embodiment of the present invention. This circuit includes insulated gate field-effect transistors such as MOS (metal-oxide-semiconductor) transistors and is formed as a complementary integrated circuit device having two kinds of transistors of mutually different conductivity types (namely, P-channel and N-channel transistors).

An input voltage $V_{IN}$ to be detected is supplied to a terminal 1. An N-channel MOS transistor $Q_1$ is connected between the input terminal 1 and a node $N_1$. The gate and drain of the transistor $Q_1$ are short-circuited at the input terminal 1. P-channel and N-channel MOS transistors $Q_2$ and $Q_3$, respectively, are connected between the node $N_1$ and a terminal 3 to which a reference potential such as the ground potential is supplied. The gates of the transistors $Q_2$ and $Q_3$ are connected to a power supply terminal 2 to which a positive voltage $V_{cc}$ is supplied. Thus, the transistors $Q_2$ and $Q_3$ compose a complementary inverter, and a detection output is obtained at its output node $N_2$. The input of a complementary inverter composed of P-channel and N-channel MOS transistors $Q_4$ and $Q_5$, respectively, is connected to the output node $N_2$. The transistors $Q_4$ and $Q_5$ are connected between the terminals 2 and 3, and its output node $N_3$ is supplied to the input of a complementary inverter composed of P-channel and N-channel MOS transistors $Q_6$ and $Q_7$, respectively. The transistors $Q_6$ and $Q_7$ are connected between the terminals 2 and 3, and have an output node that is connected to a detection output terminal 4. The substrates of the N-channel transistors $Q_1$, $Q_3$, $Q_5$ and $Q_7$ are grounded, and the substrates of the P-channel transistors $Q_2$, $Q_4$ and $Q_6$ are respectively connected to their own sources.

Figure 2:
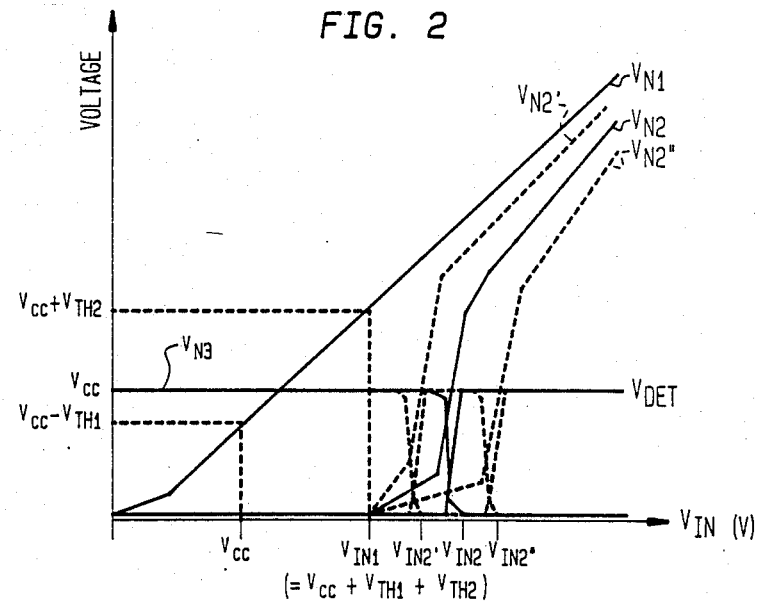
FIG. 2 is a graph showing the change in voltage at each circuit node as a function of the change in level of an input voltage $V_{IN}$ in the circuit shown in FIG. 1.

FIG. 2 shows the change in the voltage $V_{N1}$, $V_{N2}$, $V_{N3}$ and $V_{DET}$ at the nodes $N_1$, $N_2$, $N_3$ and output terminal 4, respectively, as a result of the change in the input voltage $V_{IN}$ in the circuit of FIG. 1. Since the transistor $Q_1$ is operated as a diode because of the short circuit of its gate and drain, the voltage $V_{N1}$ at the node $N_1$ takes a level which is lower than the input voltage $V_{IN}$ by the threshold voltage $V_{TH1}$ of the transistor $Q_1$ and, as shown in FIG. 2, follows the change in the input voltage $V_{IN}$. Accordingly, when the input voltage $V_{IN}$ is equal to the power voltage $V_{cc}$, the voltage $V_{N1}$ at the node $N_1$ takes a level of $(V_{cc}-V_{TH1})$. The gate of the transistor $Q_2$ is supplied with the power voltage $V_{cc}$. Since the transistor $Q_2$ is of a P-channel type, the transistor $Q_2$ is not turned ON unless its source voltage (namely, the voltage $V_{N1}$ at the node $N_1$) is higher than its gate potential by the threshold voltage $V_{TH2}$ of $Q_2$. On the other hand, the transistor $Q_3$ is conductive due to the positive gate voltage of the voltage $V_{cc}$. Thus, when the transistor $Q_2$ is OFF, the voltage $V_{N2}$ is at the ground level (low level), and the voltages $V_{N3}$ and $V_{DET}$ at the node $N_3$ and the terminal 4 are at the high level (near the voltage $V_{cc}$) and in the low level, respectively.

When the input voltage $V_{IN}$ rises to a level $V_{IN1}(=V_{cc}+V_{TH1}+V_{TH2})$, the voltage $V_{N1\ at\ the\ node\ N1}$ takes a level of $(V_{cc}+V_{TH2})$, thereby turning the transistor $Q_2$ ON. At this time, since the transistor $Q_2$ is biased only by its threshold voltage $V_{TH2}$, the conductive resistance thereof is relatively large. Accordingly, an extremely small current flows into the terminal 3 from the terminal 1 via three transistors $Q_1$, $Q_2$ and $Q_3$, and the potential at the node $N_2$ rises a little. Since the potential rise at the node $N_2$ is quite small, the voltages $V_{N3}$ and $V_{DET}$ at the node $N_3$ and the terminal 4 are not changed.

A further increase in the input voltage $V_{IN}$ enhances the voltage $V_{N1}$ at the node $N_1$ and deeply biases the transistor $Q_2$ to lower its conductive resistance. The voltage $V_{N2}$ at the node $N_2$ is thereby increased. When the voltage $V_{N2}$ exceeds the logical threshold value of the complementary inverter composed of the transistors $Q_4$ and $Q_5$, the voltage $V_{N3}$ at the node $N_3$ is changed from the high level to the low level and the voltage $V_{DET}$ at the terminal 4 is changed from the low level to the high level. The input voltage $V_{IN}$ for turning the voltage $V_{DET}$ at the output terminal 4 to the high level is shown as $V_{IN2}$ in FIG. 2. In this embodiment, the detection output $V_{DET}$ takes the high level when the input voltage $V_{IN}$ is sufficiently higher than the power supply voltage $V_{cc}$.

The circuit shown in FIG. 1 is constructed by the conventional complementary integrated circuit techniques and does not require the specific manufacturing process for controlling a threshold voltage or the like. Furthermore, it is possible to change the level $V_{IN2}$ of the input voltage $V_{IN}$ at which the detection output voltage $V_{DET}$ takes the high level by controlling the ratio of the gate widths and/or the gate lengths of the transistors $Q_2$ and $Q_3$. When the conductance of the transistor $Q_2$ is made larger than that of the transistor $Q_3$ by controlling the gate width and/or the gate length of the transistor $Q_2$, the conductive resistance of the transistor $Q_2$ becomes small. As a result, the voltage $V_{N2}$ at the node $N_2$ is changed as shown by the curve $V_{N2}'$ in FIG. 2, and the level of the input voltage $V_{IN}$ at which the detection output $V_{DET}$ takes the high level is lowered (which is indicated by $V_{IN2}'$). If the conductance of the transistor $Q_3$ is made larger than that of the transistor $O_2$, the voltage $V_{N2}$ changes as shown by the curve $V_{N2}''$. Consequently, the detection output $V_{DET}$ takes the high level when the input voltage $V_{IN}$ is at the level of $V_{IN2}''$.

The common gate connection point of the transistors $Q_2$ and $Q_3$ may be supplied with the comparison voltage other than the power voltage $V_{cc}$. The gates of the transistors $Q_2$ and $Q_3$ may be disconnected from each other, and in that case the transistor $Q_3$ is biased by the voltage that is different from the comparison voltage supplied to the gate of the transistor $Q_2$ and maintains $Q_3$ in the conductive state. Two or more transistors whose gates and drains are respectively short-circuited may be connected between the input terminal 1 and the node $N_1$. In this case, the input voltage level $V_{IN1}$ at which the transistor $Q_2$ begins to conduct is increased. One or more P-channel MOS transistors may be used for the transistor $Q_1$. In this instance, the gate of the P-channel transistor is connected to the side of the node $N_1$. In the case where the power supply terminal 2 is supplied with a negative voltage, a P-channel transistor is connected between the ground terminal 3 and the node $N_2$, and an N-channel transistor is connected between the nodes $N_2$ and $N_1$. At least one P-channel or N-channel transistor is connected between the node $N_1$ and the terminal 1. The voltage detection circuit according to the present invention is applicable to a bipolar integrated circuit device by replacing the N-channel and the P-channel transistors with NPN and PNP bipolar transistors, respectively.

Figure 3B:
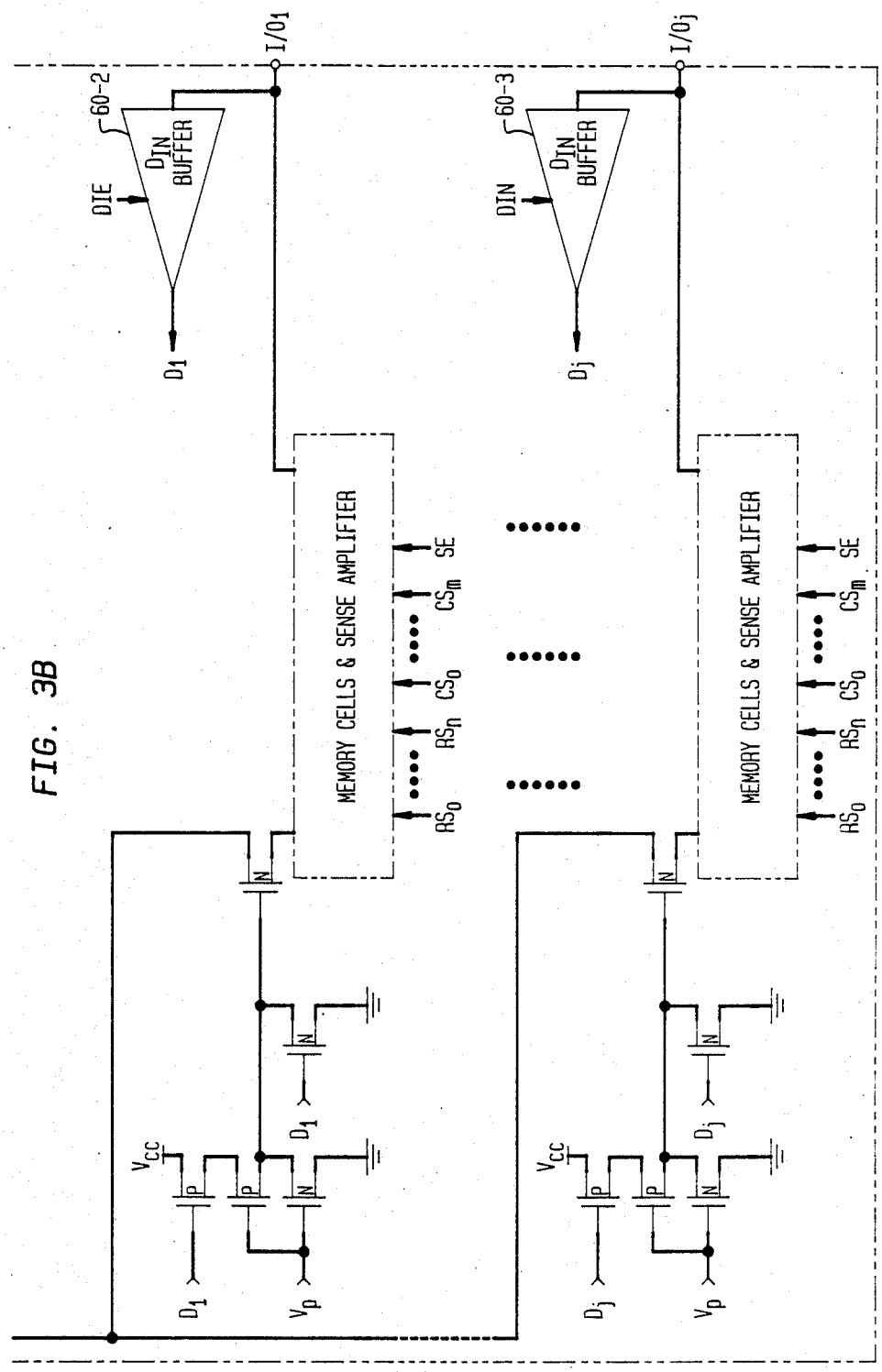
FIG. 3 is a circuit diagram representing another embodiment of the present invention.

Referring to FIG. 3, an electrically programmable read only memory device (EPROM) according to another embodiment of the present invention is shown as an integrated circuit device 100. This memory device includes a programming control terminal PGM and a programming voltage supply terminal $V_{pp}$ for a data programming, and terminals $A_o$ to $A_i$, $I/O_o$ to $I/O_j$, $V_{cc}$, GND and CE which are required for a data reading-out. When a chip-enable signal supplied to the chip-enable terminal CE is at an activating level, a timing controller 50 generates an address latch signal AL, a row decoder-enable signal RE and a column decoder-enable signal CDE. In response to the signal AL, an address buffer 10 introduces row and the column signals supplied to the address input terminals $A_o$ to $A_i$ and supplies them to a row decoder 20 and a column decoder 30. The decoder 20 activates one of the row selection signals $RS_o$ to $RS_n$ in response to the address signals and the signal RE, and the column decoder 30 activates one of the column selection signals $CS_o$ to $CS_m$ in response to the address signals and the signal CDE.

In the data programming voltage at the programming control terminal PGM is brought to the activating level. A programming controller 40 thereby supplies an input buffer-enable signal DIE to data input buffers 60-1 to 60-3. The controller 40 further supplies a sense-disable signal SDE to the timing controller 50 to inhibit the generation of the sense-enable signal SE. In the data programming mode, the programming voltage supply terminal $V_{pp}$ is applied with a voltage higher than the power voltage supplied to the power supply terminal $V_{cc}$. As described in FIGS. 1 and 2, the voltage detection circuit composed of transistors $Q_{10}$ to $Q_{16}$ detects the voltage level supplied to the terminal $V_{pp}$. It is noted that a complementary inverter composed of transistors $Q_{30}$ and $Q_{31}$ is further provided. Accordingly, the detection output $V_p$ takes the low level in the data programming mode. In response to the low level of the output $V_p$, a P-channel transistor $Q_{18}$ is turned ON and an N-channel transistor $Q_{19}$ is turned OFF.

The input buffer 60-1 is activated by the signal DIE and the sense-amplifier 70-1 is deactivated. Accordingly, the data to be programmed is introduced to the input buffer 60-1 via the input/output terminal $I/O_o$. If the output $D_o$ of the buffer 60-1 is "0" (i.e., low level), a P-channel transistor $Q_{17}$ is turned ON and an N-channel transistor $Q_{20}$ is cut off. Thus, an N-channel transistor $Q_{21}$ is driven to conduction.

Assuming that the row and the column decoders 20 and 30 generate the signals $RS_o$ and $CS_o$, respectively, in response to the address signals, an N-channel transistor $QC_1$ and a memory cell $MC_{11}$ are driven to conduction. Each of memory cells $MC_{11}$ to $MC_{mn}$ is composed of the so-called floating-gate type field effect transistor. By the conduction of the transistors $Q_{21}$ and $QC_1$, the programming voltage $V_{pp}$ is supplied to the memory cell $MC_{11}$ and electrons are injected into the floating gate of the cell $MC_{11}$ to bring it into the programmed state. When the address signals change, another memory cell is selected to receive the programming voltage $V_{pp}$.

In a data read-out mode, the terminal PGM is inverted to the non-activating level. The programming controller 40 does not generate the signals DIE and SDE. Thus, the input buffers 60-1 to 60-3 are driven to the deactivated state. The timing controller 50 generates a sense-enable signal SE along with the signals AL, RE and CDE. By this, the sense-amplifier (70-1, etc.) is activated. The power supply voltage $V_{cc}$ is applied to the terminal $V_{pp}$ in the data read-out mode. Accordingly, the voltage detection output $V_p$ takes the high level. The transistors $Q_{18}$ and $Q_{19}$ are turned OFF and ON, respectively. As a result, the gate voltage of the transistor $Q_{21}$ takes the low level irrespective of the level of the output $D_o$ of the input buffer 60-1. The transistor $Q_{21}$ is thus turned OFF. The voltage at the terminal $V_{pp}$ is not supplied to the memory cell. The data in the memory cell selected by the row and column decoders 20 and 30 is thus supplied to the sense-amplifier 70-1 and is outputted from the terminal $I/O_o$.

As apparent from FIG. 3, in order to carry out the data programming and the data read-out operations with respect to a plurality of input and output terminals $I/O_o$ to $I/O_j$, the equivalent of the circuit which is provided for the input and output terminal $I/O_o$ and composed of the transistors $Q_{17}$ to $QC_m$, the memory cells $MC_{11}$ to $MC_{nm}$, the sense-amplifier 70-1 and the input buffer 60-1 is provided for each of the input and output terminals $I/O_i$ to $I/O_j$.

Figure 4:
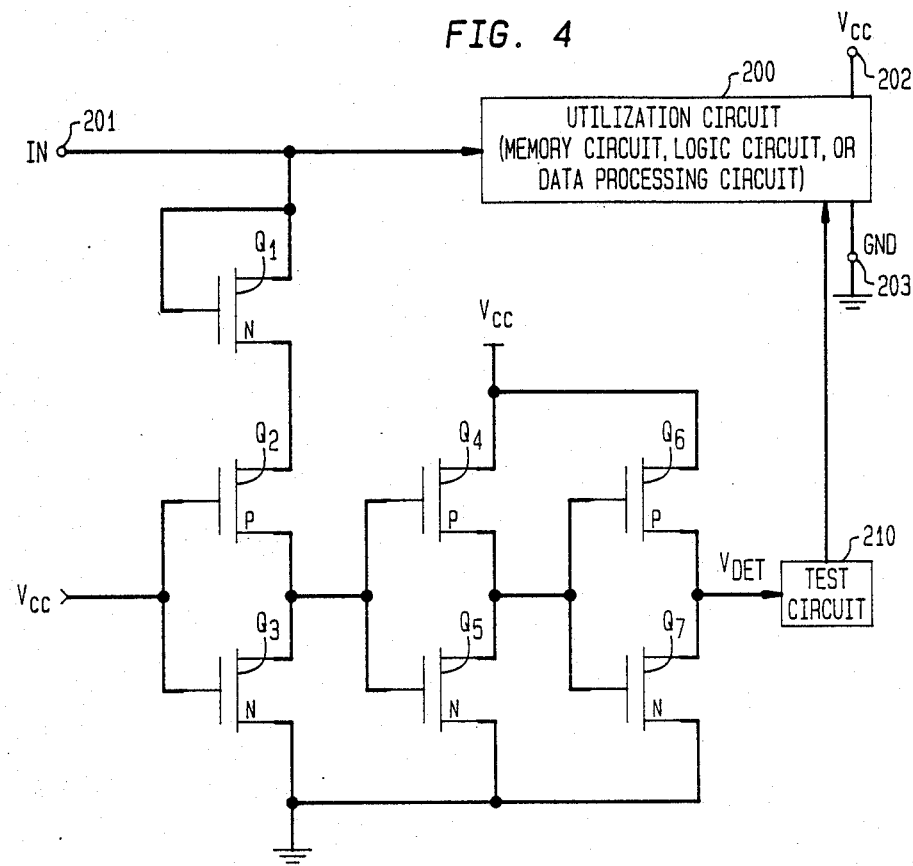
FIG. 4 is a circuit diagram indicating still another embodiment of the present invention.

FIG. 4 shows still another embodiment of the present invention. A block 200 may include the EPROM shown in FIG. 3 or a random access memory of a static or a dynamic type. A logical circuit or a data processing circuit may be also applied to the block 200. When the memory circuit is employed in the block 200, an address terminal may be used as a terminal 201. When the block 200 has a logical circuit function or a data processing function, a signal input terminal is utilized as the terminal 201. The block 200 is connected between a power source terminal 202 and a ground terminal 203 and operates by a power voltage $V_{cc}$. In an ordinary operation mode, the signal supplied to the terminal 201 takes a level which changes between the ground potential and the power potential $V_{cc}$.

Connected to the terminal 201 is the voltage detection circuit composed of the transistors $Q_1$ to $Q_7$ as described in FIGS. 1 and 2, and its detection output $V_{DET}$ is supplied to a test circuit 210. The test circuit 210 operatively brings the operation mode of the block 200 into a test mode.

In the steady operation mode of the block 200, the signal level supplied to the terminal 201 does not exceed the power voltage level. Thus, the detection output $V_{DET}$ is at the low level. The test circuit 210 is thereby in the deactivated state and does not carry out the test operation of the block 200.

When the terminal 201 is supplied with a voltage higher than the power supply voltage $V_{cc}$, the detection output $V_{DET}$ is inverted to the high level. As a result, the test circuit 210 is activated to bring the circuit operation of the block 200 into the testing mode. That is, the control of the steady operation mode or the test operation mode is performed by the level of the signal supplied to the terminal 201.

The present invention is not limited to the above-mentioned embodiments, but may be changeable and modifiable without departing from the scope and spirit of the present invention.

What is claimed is:

1. A detection circuit for detecting an application of an input voltage which is higher in absolute value than a power voltage, comprising:
   an input terminal supplied with said input voltage;
   a power terminal supplied with said power voltage;
   a reference terminal supplied with a reference potential;
   a first field effect transistor having drain-source current path connected between said input terminal and said first node and a gate short-circuited with a drain, said first field effect transistor operating as a diode to supply said first node with a voltage that is lower in absolute value than said input voltage by a threshold voltage of said first field effect transistor;
   a second field effect transistor having a drain-source current path connected between said first node and said second node and a gate connected directly to said power terminal;
   a third field effect transistor having a source-drain current path connected between said second node and said reference terminal and a gate connected directly to said power terminal, said second and third field effect transistors being different in conductivity type from each other; and an inverter operative with said power voltage and said reference potential and having its input terminal connected to said second node, said inverter producing a detection output signal indicating that said input voltage has a level higher in absolute value than a sum voltage of said power voltage, said threshold voltage of said first field effect transistor and a threshold voltage of said second field effect transistor.

2. The circuit as claimed in claim 1, wherein said first field effect transistor is the same conductivity type as said third field effect transistor, the gate and drain of said first field effect transistor being connected in common to said input terminal.

3. A programmable read only memory device comprising:

a programming terminal supplied with a programming voltage;

a power terminal supplied with a power voltage;

a reference terminal supplied with a reference potential;

a plurality of memory cells;

means responsive to address signals for selecting at least one of said memory cells;

a detection circuit for detecting an application of said programming voltage higher in absolute value than said power voltage and producing a detection signal; and means responsive to said detection signal for supplying said programming voltage to the selected memory cell;

said detection circuit including a first node and a second node;

a first field effect transistor connected between said programming terminal and said first node and having a gate of said first field effect transistor connected to a drain of said first field effect transistor;

a second field effect transistor of a first channel type connected between said first node and said second node and having a gate of said second field effect transistor connected directly to said power supply;

a third field effect transistor of a second channel type connected between said second node and said reference terminal and having a gate of said third field effect transistor connected directly to said power supply; and an inverter operative with said power voltage and said reference potential and having its input terminal connected to said second node, said inverter producing said detection signal.

4. An integrated circuit comprising:

a power terminal supplied with a power voltage;

a reference terminal supplied with a reference potential;

a signal terminal;

a transistor circuit supplied through said signal terminal with an input signal, said input signal taking a level that is within a range between said power voltage and said reference potential upon a steady operation mode, said signal terminal being supplied with a testing voltage upon a test operation mode, said testing voltage taking a level that is higher in absolute value than said power voltage;

a detection circuit detecting an application of said testing voltage to said signal terminal; and a test circuit testing said transistor circuit in response to said detection signal;

said detection circuit including a first field effect transistor connected between said signal terminal and a first node and having a gate of said first field effect transistor connected to a drain of said first field effect transistor;

a second field effect transistor of a first conductivity type connected between said first node and a second node and having a gate of said second field effect transistor connected directly to said power terminal; and a third field effect transistor of a second conductivity type connected between said second node and said reference terminal and having a gate of said third field effect transistor connected directly to said power terminal.

* * * * *